(12) United States Patent
Shankar

(10) Patent No.: US 10,819,351 B1
(45) Date of Patent: Oct. 27, 2020

(54) GATE DRIVER CIRCUIT WITH A CLOSED LOOP OVERDRIVE GENERATOR

(71) Applicant: TEXAS INSTRUMENTS INCORPORATED, Dallas, TX (US)

(72) Inventor: Krishnamurthy Ganapathi Shankar, Bengaluru (IN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 16/423,266

(22) Filed: May 28, 2019

(51) Int. Cl.
  *H03L 7/089* (2006.01)
  *H03K 17/687* (2006.01)
  *H03K 17/60* (2006.01)

(52) U.S. Cl.
  CPC ........... *H03L 7/0895* (2013.01); *H03K 17/60* (2013.01); *H03K 17/6872* (2013.01)

(58) Field of Classification Search
  CPC combination set(s) only.
  See application file for complete search history.

(56) References Cited

U.S. PATENT DOCUMENTS

| 5,276,358 | A | * | 1/1994 | Carvajal | H03K 17/166 |
| | | | | | 327/13 |
| 5,644,484 | A | * | 7/1997 | Elango | G11B 5/5526 |
| | | | | | 363/132 |
| 6,002,290 | A | * | 12/1999 | Avery | H03K 3/356113 |
| | | | | | 326/62 |
| 6,734,704 | B1 | * | 5/2004 | Burkland | H03K 17/04163 |
| | | | | | 326/63 |
| 8,692,576 | B2 | * | 4/2014 | Heath | H03K 19/01707 |
| | | | | | 326/115 |
| 9,496,873 | B2 | * | 11/2016 | Li | H03K 19/0185 |
| 10,128,846 | B2 | * | 11/2018 | Mallavajula | H03K 19/0013 |
| 10,642,306 | B1 | * | 5/2020 | Shankar | H02H 7/1213 |
| 2006/0001447 | A1 | * | 1/2006 | De Langen | H03K 19/018528 |
| | | | | | 326/80 |
| 2007/0064460 | A1 | * | 3/2007 | Sinnan-Tov | H02P 7/04 |
| | | | | | 363/132 |
| 2007/0126504 | A1 | * | 6/2007 | Macphail | H03F 3/217 |
| | | | | | 330/251 |
| 2008/0284209 | A1 | * | 11/2008 | Fukazawa | H03K 17/6871 |
| | | | | | 296/193.04 |
| 2010/0231312 | A1 | * | 9/2010 | Denier | H03K 3/0231 |
| | | | | | 331/111 |

(Continued)

FOREIGN PATENT DOCUMENTS

JP                08018340 A  *  1/1996  ........... H03K 3/3545

*Primary Examiner* — Adam D Houston
(74) *Attorney, Agent, or Firm* — John R. Pessetto; Charles A. Brill; Frank D. Cimino

(57) ABSTRACT

A driver circuit comprises a first transistor coupled to a second transistor, and a third transistor coupled to the first and second transistor and to a first current mirror. An output of the first current mirror is provided to a control input of the second transistor. A second current mirror is coupled to the output of the first current mirror. A first current source, a second current source, and a fourth transistor are coupled to the second current mirror. The second current source is further coupled to a fifth transistor. A sixth transistor is coupled to the fifth transistor and to a third current mirror. In some implementations, the driver circuit is coupled to a low side transistor in an H bridge driver and the second transistor is matched to the low side transistor.

12 Claims, 10 Drawing Sheets

(56) References Cited

U.S. PATENT DOCUMENTS

| | | | |
|---|---|---|---|
| 2012/0139583 A1* | 6/2012 | Tseng | H03K 19/0016 |
| | | | 326/83 |
| 2012/0229173 A1* | 9/2012 | Ji | H03K 17/08122 |
| | | | 327/109 |
| 2013/0049808 A1* | 2/2013 | Panov | H03K 19/018507 |
| | | | 326/80 |
| 2015/0341034 A1* | 11/2015 | Varkony | H03K 3/35613 |
| | | | 327/333 |
| 2018/0083615 A1* | 3/2018 | Kono | H01L 29/7802 |
| 2018/0115268 A1* | 4/2018 | Li | H02P 25/034 |
| 2019/0044463 A1* | 2/2019 | Bavois | G05F 1/56 |
| 2019/0207596 A1* | 7/2019 | Sakakibara | H03K 19/0185 |
| 2020/0059224 A1* | 2/2020 | Jiang | H03K 5/00 |

\* cited by examiner

GATE DRIVER CIRCUIT WITH A CLOSED LOOP OVERDRIVE GENERATOR

BACKGROUND

H bridge drivers include two high side transistors and two low side transistors, and are configured such that each high side transistor is in series with a respective low side transistor and a load is coupled to the nodes between the pairs of high side and low side transistors. Each pair of high side and low side transistors is called a half bridge. A gate driver circuit converts a control signal to a power signal that can efficiently turn on and off each transistor in the H bridge driver. To prevent shoot-through conditions within a half bridge during transitions from high to low or low to high, dead time is inserted between turning off of one transistor and turning on of the other. The length of the dead time is often equal to the time required to turn on or turn off a transistor in the H bridge driver. However, dead time limits the operating frequency of the H bridge driver and causes power dissipation through transistors in the H bridge driver.

Some gate driver circuits reduce power dissipation during dead time by turning the transistor on and off more quickly. This may increase the efficiency of the H bridge driver, but at the cost of creating electromagnetic interference (EMI) in the integrated circuit (IC), disrupting operation of other circuits in the IC. Some gate driver circuits balance the need for quick turn on and turn off times with controlled EMI by implementing comparators to detect different regions of operation for each transistor during turn on and turn off, and quickening only the regions that are unlikely to cause EMI. However, the load current through the transistor influences how long the transistor spends in each region of operation during turn on and turn off, and by extension the amount of drive current needed to turn the transistor on and off. For small transistors, the possible variation in load current may be several orders of magnitude. Some gate driver circuits generate drive current without sensing or adjusting for the load current, which forces the driver circuits to operate assuming the worst-case scenario and leads to inefficiencies.

SUMMARY

In some implementations, a driver circuit comprises a first transistor coupled to a second transistor, and a third transistor coupled to the first and second transistor and to a first current mirror. An output of the first current mirror is provided to a control input of the second transistor. A second current mirror is coupled to the output of the first current mirror. A first current source, a second current source, and a fourth transistor are coupled to the second current mirror. The second current source is further coupled to a fifth transistor. A sixth transistor is coupled to the fifth transistor and to a third current mirror. In some implementations, the driver circuit is coupled to a low side transistor in an H bridge driver and the second transistor is matched to the low side transistor.

In some implementations, a current terminal of the first transistor is coupled to a current terminal of the low side transistor and receives a first voltage. The second and third current mirrors and a control input of the first transistor are coupled to a control input of the low side transistor and receive a second voltage. In some implementations, the sixth transistor receives a control signal indicating the low side transistor should be turned on and causes the driver circuit to turn on the low side transistor. In some implementations, the fourth transistor receives a control signal indicating the low side transistor should be turned off and causes the driver circuit to turn off the low side transistor.

BRIEF DESCRIPTION OF THE DRAWINGS

For a detailed description of various examples, reference will now be made to the accompanying drawings in which:

FIGS. 4A-C show gate to source voltages of a low side transistor with a higher load current and a lower load current, corrected gate to source voltages of a low side transistor with a higher load current and a lower load current, and the corresponding voltages on an output node of an example H bridge motor driver during transistor turn on.

DETAILED DESCRIPTION

As described herein, a gate driver circuit includes current mirrors and transistors coupled together in a configuration that permits adjustment of the drive current based on a load current through a low side transistor driven by the gate driver circuit. By sensing the load current, the gate driver circuit can determine which region of operation the low side transistor driven is in, and adjust the drive current accordingly. This allows the gate driver circuit to reduce power dissipation through the low side transistor during turn on and turn off and increase the operating frequency of an H bridge driver circuit including the low side transistor by quickening transistor turn on and turn off and reducing dead time between turn off of one transistor and turn on of another in the H bridge driver circuit.

In one example, the gate driver circuit includes a first and a second transistor coupled together. A third transistor is coupled to the first and second transistors and to a first current mirror, the output of which is coupled to the control input of the second transistor. A second current mirror is coupled to the control input of the second transistor and the output of the first current mirror. The second current mirror is further coupled to a first current source, a fourth transistor, and a second current source. The control input of a fifth transistor is coupled to the second current mirror and the second current source. A sixth transistor is coupled to the fifth transistor and a third current mirror. The first transistor, the second current mirror, and the third current mirror are configured to receive a voltage on the control input of a low side transistor driven by the gate driver circuit.

The second transistor is chosen to have similar characteristics to the low side transistor driven by the gate driver circuit and mimic the low side transistor's behavior in the saturation region. The fourth transistor is configured to receive a control signal that is logic high in response to a control scheme for the H bridge driver indicates the low side transistor is to be turned off. The sixth transistor is configured to receive a control signal that is logic high in response to a control scheme for the H bridge driver indicates the low side transistor is to be turned on. The second current mirror is configured to generate current in response to the voltage on the control input of the low side transistor being greater than a voltage on the control input of the second transistor and generate no current in response to the voltage on the control input of the low side transistor being less than a voltage on the control input of the second transistor.

Figure 1:
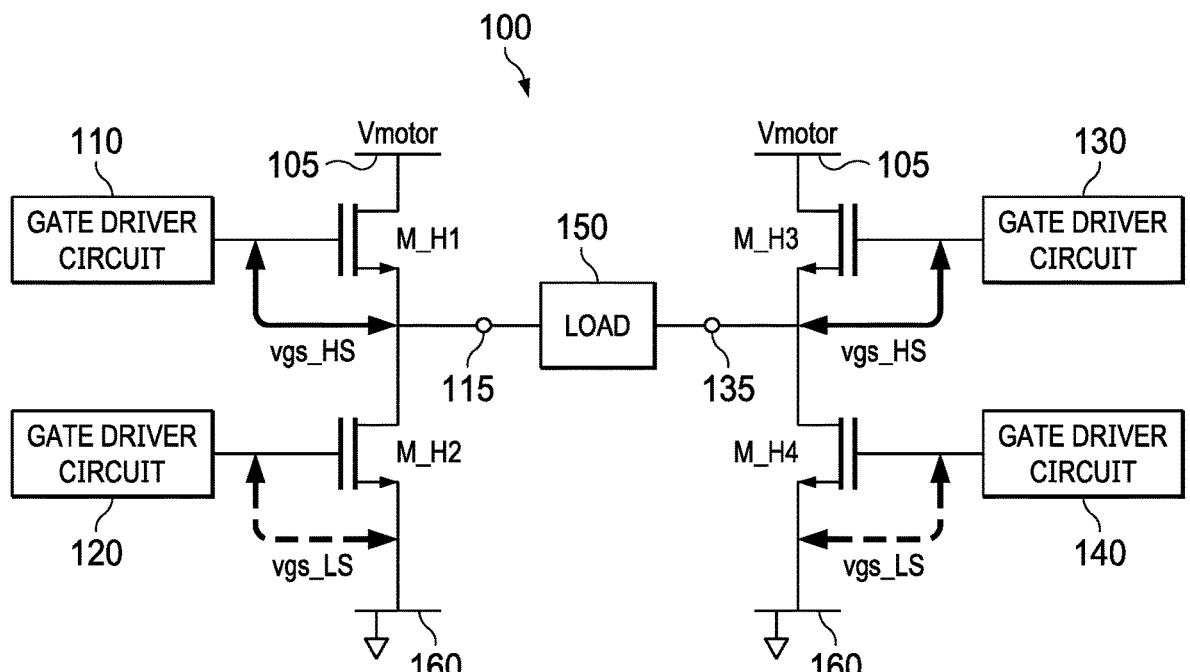
FIG. 1 illustrates an example H bridge motor driver.

FIG. 1 illustrates an example H bridge motor driver 100. Although FIG. 1 illustrates an H bridge implemented as a motor driver, H bridges and the gate driver circuits described herein can be used in a variety of applications, including other kinds of power electronics and the like. Example H bridge motor driver 100 includes high-side power field-effect transistors (FETs) M_H1 and M_H3 and low-side power FETs M_H2 and M_H4. A source terminal of M_H1 is coupled to a drain terminal of M_H2 at node 115, forming a half-bridge configuration. A source terminal of M_H3 is coupled to a drain terminal of M_H4 at node 135, forming another half-bridge configuration. The drain terminals of M_H1 and M_H3 are coupled to receive a supply voltage Vmotor at node 105. The source terminals of M_H2 and M_H4 are coupled to receive a common mode voltage at node 160. In some examples, the common mode voltage at node 160 is ground. Node 115 and node 135 form output nodes of the H bridge motor driver 100 and load 150 is coupled to nodes 115 and 135.

The gate terminals of each of M_H1, M_H2, M_H3, and M_H4 are coupled to respective gate driver circuits. The gate terminal of M_H1 is coupled to receive a gate driving current from gate driver circuit 110. The gate terminal of M_H2 is coupled to receive a gate driving current from gate driver circuit 120. The gate terminal of M_H3 is coupled to receive a gate driving current from gate driver circuit 130. The gate terminal of M_H4 is coupled to receive a gate driving current from gate driver circuit 140.

H bridge motor driver 100 includes metal oxide semiconductor field-effect transistors (MOSFETs). M_H1, M_H2, M_H3, and M_H4 are n-type MOSFETs (NMOS) in this example. In other examples, one or more of M_H1, M_H2, M_H3, and M_H4 are p-type MOSFETs (PMOS) or bipolar junction transistors. A bipolar junction transistor includes a base corresponding to the gate terminal, and a collector and an emitter corresponding to the drain and source terminals. The base of a bipolar junction transistor and the gate terminal of a MOSFET are also called control inputs. The collector and emitter of a bipolar junction transistor and the drain and source terminals of a MOSFET are also called current terminals.

Figure 2:
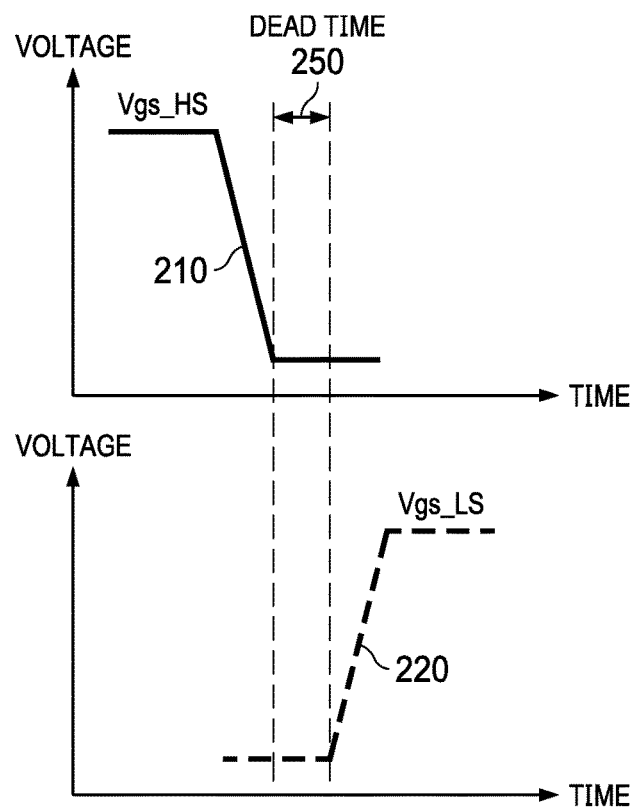
FIG. 2 shows the gate to source voltages of a high side transistor and a low side transistor in an example H bridge motor driver over time.

FIG. 2 shows the gate to source voltage Vgs_HS 210 of M_H1 and the gate to source voltage Vgs_LS 220 of M_H2 in example H bridge motor driver 100 over time. To prevent shoot-through current, the switching scheme controlling M_H1 and M_H2 includes a dead time 250 in which neither the high side transistor M_H1 nor the low side transistor M_H2 are on. This ensures that M_H1 is fully off before M_H2 turns on. As discussed previously, dead time 250 slows the switching frequency achievable by H bridge motor driver 100 and increases power dissipated through H bridge motor driver 100. To counter this, some motor drivers increase the slew rate, the speed at which the transistors turn on and off, reducing the propagation delay. Increasing the slew rate may also increase EMI and create noise that interferes with operation of other circuits within the IC. As EMI impacts operation of other circuits, some gate driver circuits prioritize the slew rate and EMI requirements of the IC over switching frequency.

Figure 3:
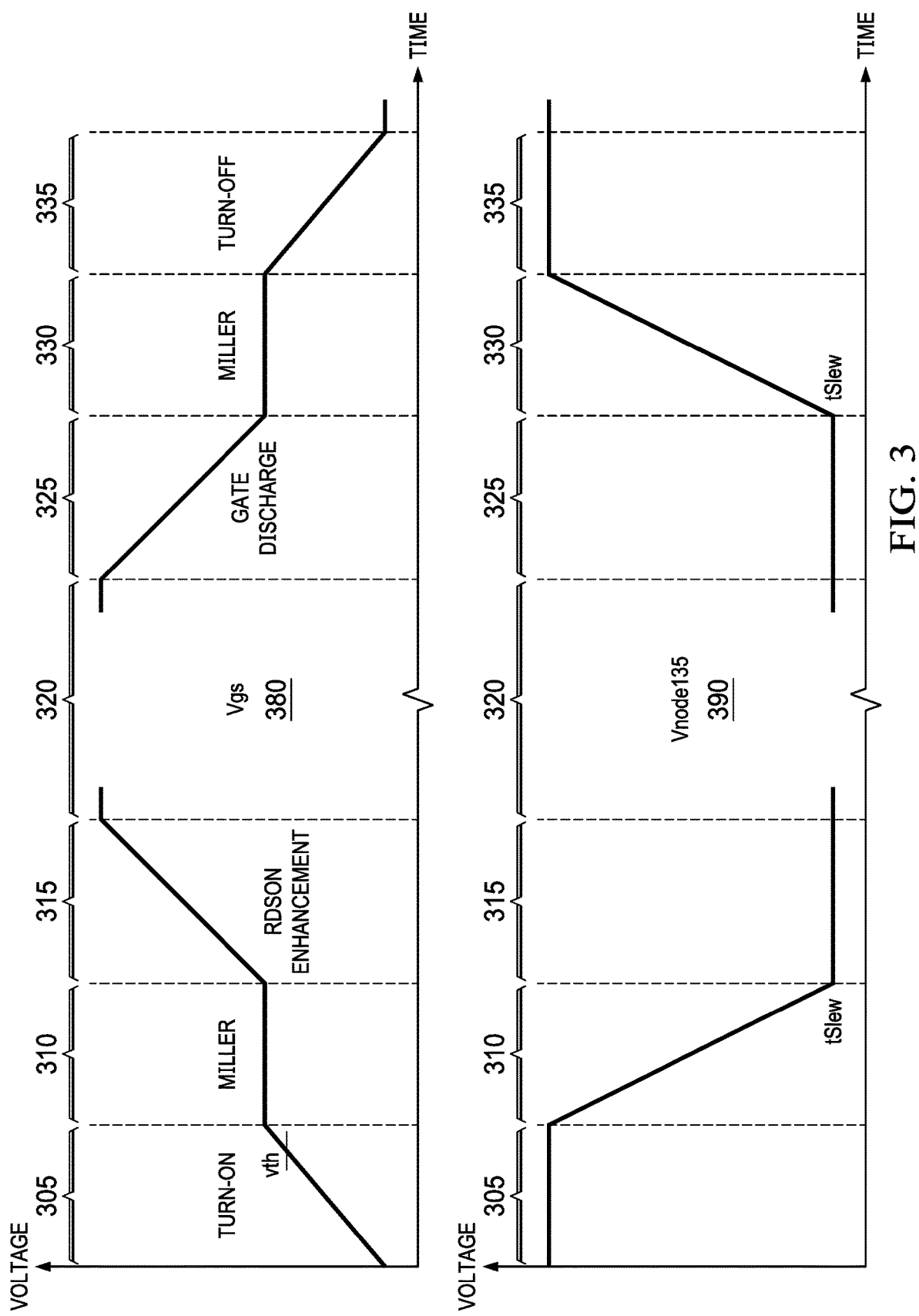
FIG. 3 shows the gate to source voltage of a low side transistor, and the voltage on an output node of an example H bridge motor driver over time.

FIG. 3 shows the gate to source voltage Vgs 380 of the low side transistor M_H4 and the voltage Vnode135 390 on output node 135 in the example H bridge motor driver 100 over time. FIG. 3 is described in the context of M_H4 in H bridge motor driver 100, but low side transistor M_H2, or other low side transistors in other H bridge drivers will experience similar gate to source voltages and voltages on an output node. Regions 305-315 correspond to transistor turn on. In region 320, M_H4 is kept in an on state while in regions 325-335, the transistor is turned off. Region 305 is the transistor turn-on region, in which the gate to source capacitance Cgs of M_H4 is charged to the threshold voltage Vth. While Vgs 380 is greater than Vth, the transistor conducts current. The ramp rate in region 305 is proportional to $$\frac{Idrive}{(Cgs + Cgd)},$$

where Idrive is the current applied to the gate terminal of the transistor, and Cgd is the gate to drain capacitance of the transistor. After the transistor conducts current, the drain current Idrain through the transistor increases until it reaches the load current ILoad, and Vgs 380 increases until it reaches a Miller voltage. The Miller voltage is proportional to $$Vth + \frac{Idrain}{g},$$

where g is the transconductance of the transistor. Because Idrain depends on the desired load current ILoad through M_H4 and H bridge motor driver 100, the Miller voltage does also.

Region 310 is known as the Miller region, in which Vgs 380 remains constant at the Miller voltage, and Vnode135 390 decreases as Cgd is charged. The length of time spent in region 310, tSlew, is proportional to $$\frac{Idrive}{Cgd}.$$

Because region 310 and the decreasing Vnode135 390 can create EMI and noise in other circuits on the IC, tSlew and the corresponding drive current Idrive are determined according to the requirements of the IC and the amount of EMI other circuits on the IC can withstand. After Cgd is charged, the conducting channel of M_H4 is fully enhanced by applying a higher gate drive voltage and drive current Idrive to the gate terminal in region 315, known as the RDSON enhancement region. The ramp rate in region 315 is proportional to $$\frac{Idrive}{(Cgs+Cgd)}.$$

After Vgs 380 reaches the on voltage of the transistor and enters region 320, M_H4 is in an on state.

During transistor turn off, Vgs 380 decreases as the gate capacitance of M_H4, Cgs+Cgd, is discharged to the Miller voltage in region 325. The gate current is supplied by the gate capacitance, and the ramp rate is proportional to $$\frac{Idrive}{Cgs+Cgd},$$

After the gate voltage reaches the Miller voltage, Vnode135 390 increases as Cgd discharges further. The length of time spent in region 330, tSlew, is proportional to $$\frac{Idrive}{Cgd}.$$

As in region 310, region 330 and the increasing Vnode135 390 can cause EMI and noise in other circuits on the IC. TSlew and the corresponding drive current are determined according to the requirements of the IC and the amount of EMI other circuits on the IC can withstand. In region 335, both Cgs and Cgd are discharged to zero volts, decreasing Vgs 380 to zero volts and turning off the transistor. The ramp rate is proportional to $$\frac{Idrive}{(Cgs+Cgd)}.$$

To increase switching efficiency and optimize turn on, turn off, and the three regions of operation in each while maintaining the EMI caused during switching within the requirements of the IC, the drive current Idrive is varied in each region of operation. The varying drive current Idrive speeds transistor turn on in regions 305 and 315 and transistor turn off in regions 325 and 335 but carefully controls turn on and turn off speed in regions 310 and 330, such that the EMI created stays within acceptable limits for the IC. Because the Miller voltage varies based on the desired load current ILoad, gauging the transitions from region 310 to 315, and from 325 to 330 can be difficult.

Figure 4A:
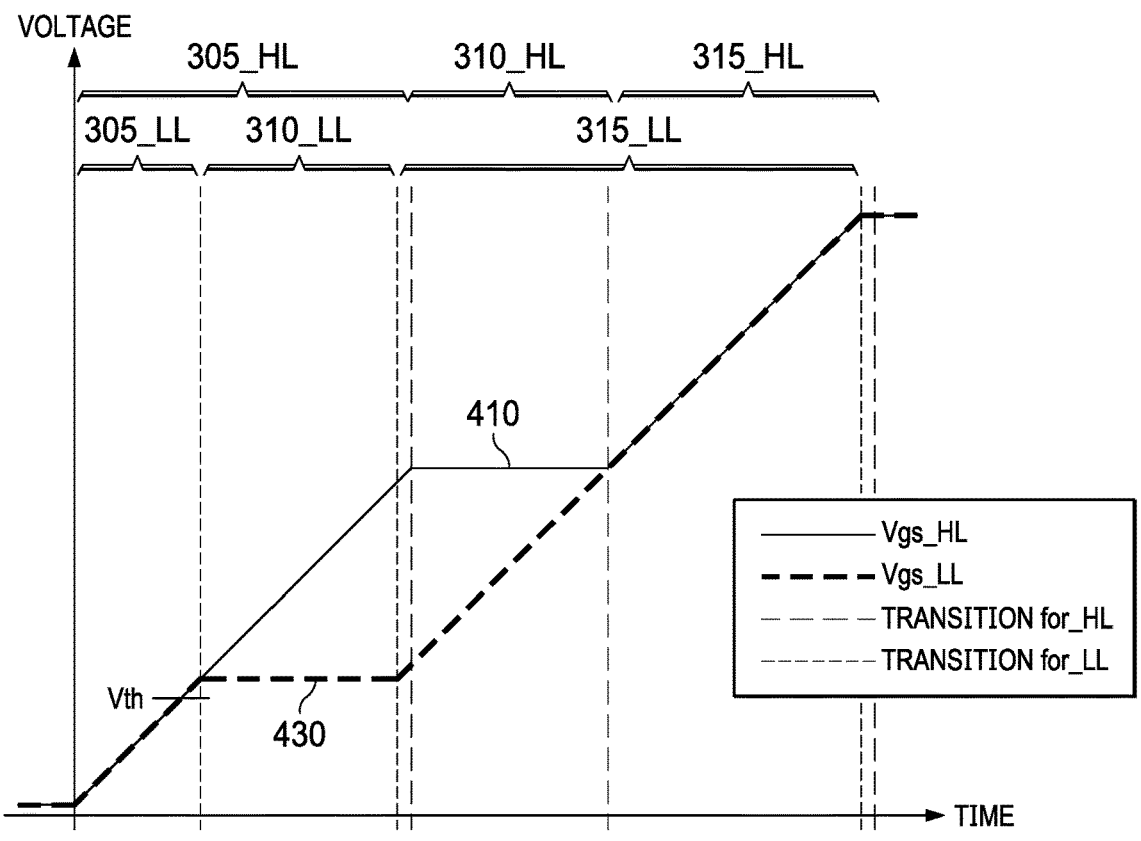
Figure 4A:
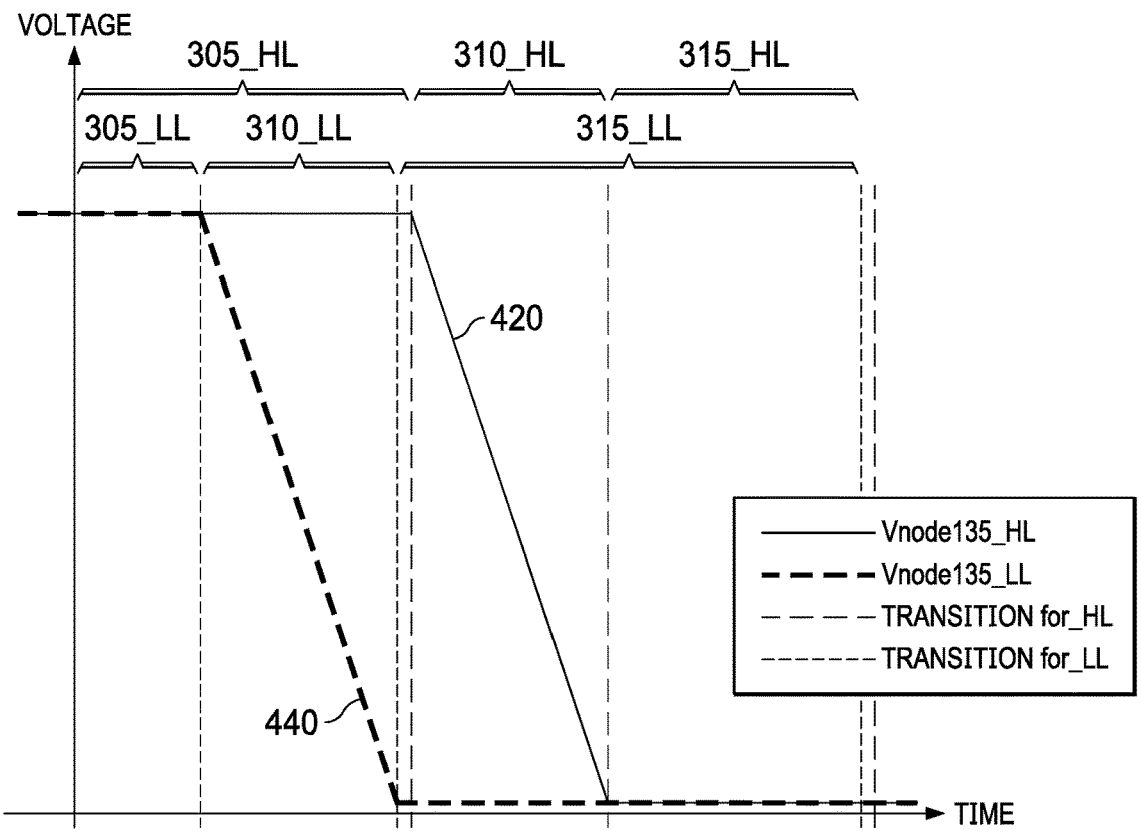
Figure 4B:
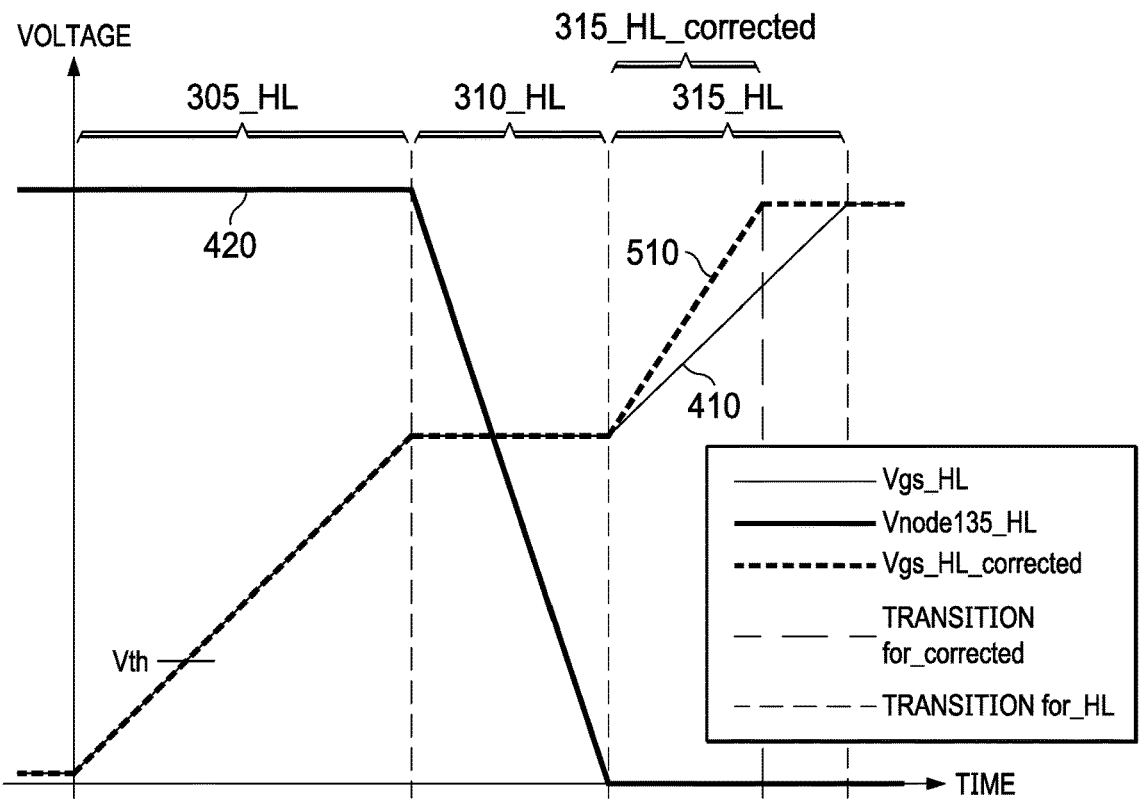
Figure 4C:
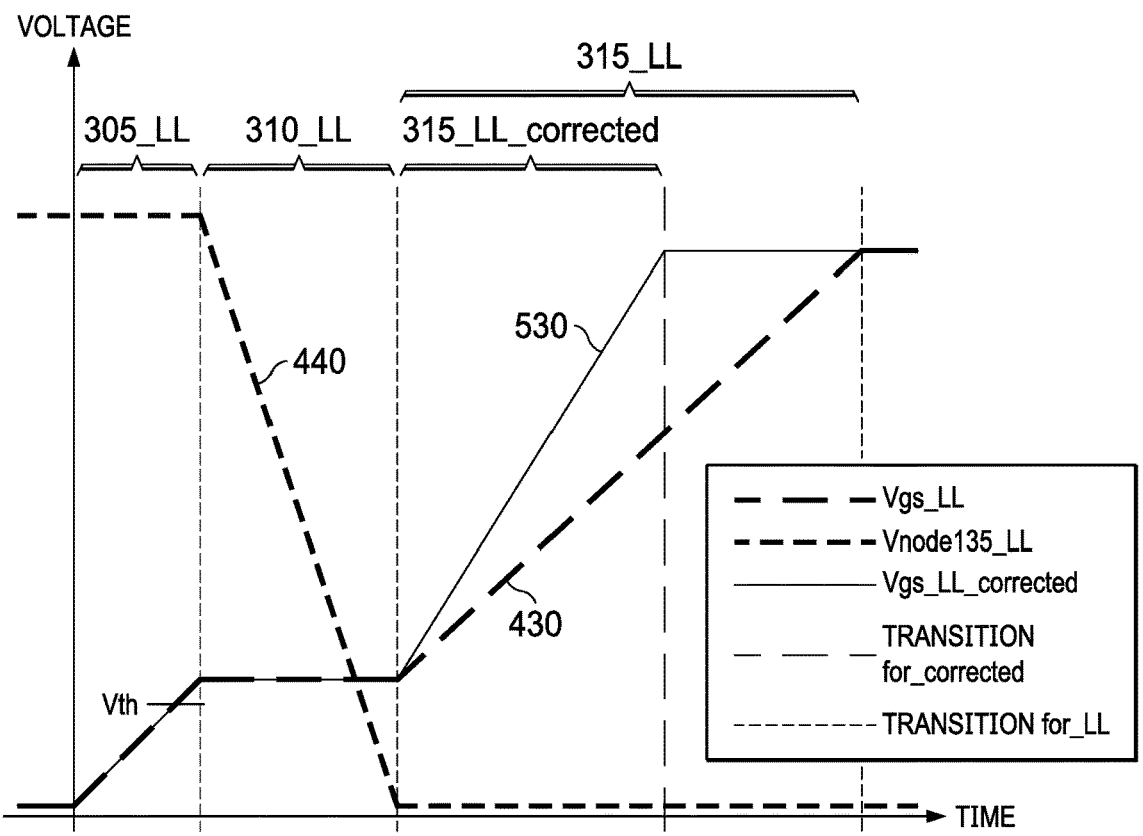

FIGS. 4A-C illustrate the variation in Miller voltages due to variation in load currents during transistor turn on. Vgs_HL 410 and Vnode135_HL 420 represent the gate to source voltage of M_H4 and the voltage on output node 135 while M_H4 passes a relatively high load current ILoad. Vgs_LL 430 and Vnode135_LL 440 represent the gate to source voltage of M_H4 and the voltage on output node 135 while M_H4 passes a relatively low load current ILoad. Because the desired load currents are different, Vgs_HL 410 and Vgs_LL 430 have different Miller voltages, and reach them at different times during transistor turn on. Because the Miller plateaus begin at different times, Vnode135_HL 420 and Vnode135_LL 440 decrease at different times in transistor turn on. A gate driver circuit that generates drive current without sensing the load current ILoad is unable to determine the voltage transitions from the Miller region 310, and so must be designed to accommodate all possible transition voltages.

A "worst-case scenario" gate driver circuit must wait to increase the drive current Idrive and speed transistor turn on in region 315 until the gate to source voltage increases above the highest possible Miller voltage corresponding to the highest possible load current, even where the load current ILoad and the Miller voltage are much lower, as shown with respect to Vgs_LL 430. FIG. 4A shows the gate to source voltage with a higher load current Vgs_HL 410 in combination with the corresponding output voltage Vnode135_HL 420 during turn on regions 305_HL, 310_HL, and 315_HL. FIG. 4A also shows the gate to source voltage with a lower load current Vgs_LL 430 in combination with the corresponding output voltage Vnode135_LL 440 during turn on regions 305_LL, 310_LL, and 315_LL. If the drive current Idrive is left the same for both the higher load current and the lower load current, the transistor completes turn on and reaches region 320 at the same time regardless of the load current ILoad.

FIG. 4B shows the conventional and corrected gate to source voltages of a low side transistor with a higher load current and the corresponding output voltage Vnode135_HL 420 during turn on regions 305_HL, 310_HL, 315_HL, and 315_HL_corrected. Conventional Vgs_HL 410 corresponds to a gate driver circuit that generates drive current without sensing the load current ILoad. In contrast, Vgs_HL_corrected 510 corresponds to a gate driver circuit that senses the load current ILoad, and gauges the Miller voltage and Miller region 310 based on the sensed load current. This allows the gate driver circuit to correctly identify the transition from region 310 to region 315, and increase the drive current Idrive accordingly. This increases Vgs_HL_corrected 510 more quickly than Vgs_HL 410 increases, shortening the length of time spent in region 315_HL_corrected compared to 315_HL, and completes transistor turn on sooner.

FIG. 4C shows the conventional and corrected gate to source voltages of a low side transistor with a lower load current Vgs_LL 430 and the corresponding output voltage Vnode135_LL 440 during turn on regions 305_LL, 310_LL, 315_LL, and 315_LL_corrected. Conventional Vgs_LL 430 corresponds to a gate driver circuit that generates drive current without sensing the load current ILoad. In contrast, Vgs_LL_corrected 530 corresponds to a gate driver circuit that senses the load current ILoad, and gauges the Miller voltage and Miller region 310 based on the sensed load current. This allows the gate driver circuit to correctly identify the transition from region 310 to region 315 and increase the drive current Idrive accordingly. This increases Vgs_LL_corrected 530 more quickly than Vgs_LL 430 increases, shortening the length of time spent in region 315_LL_corrected compared to 315_LL, and completes transistor turn on sooner.

Figure 5A:
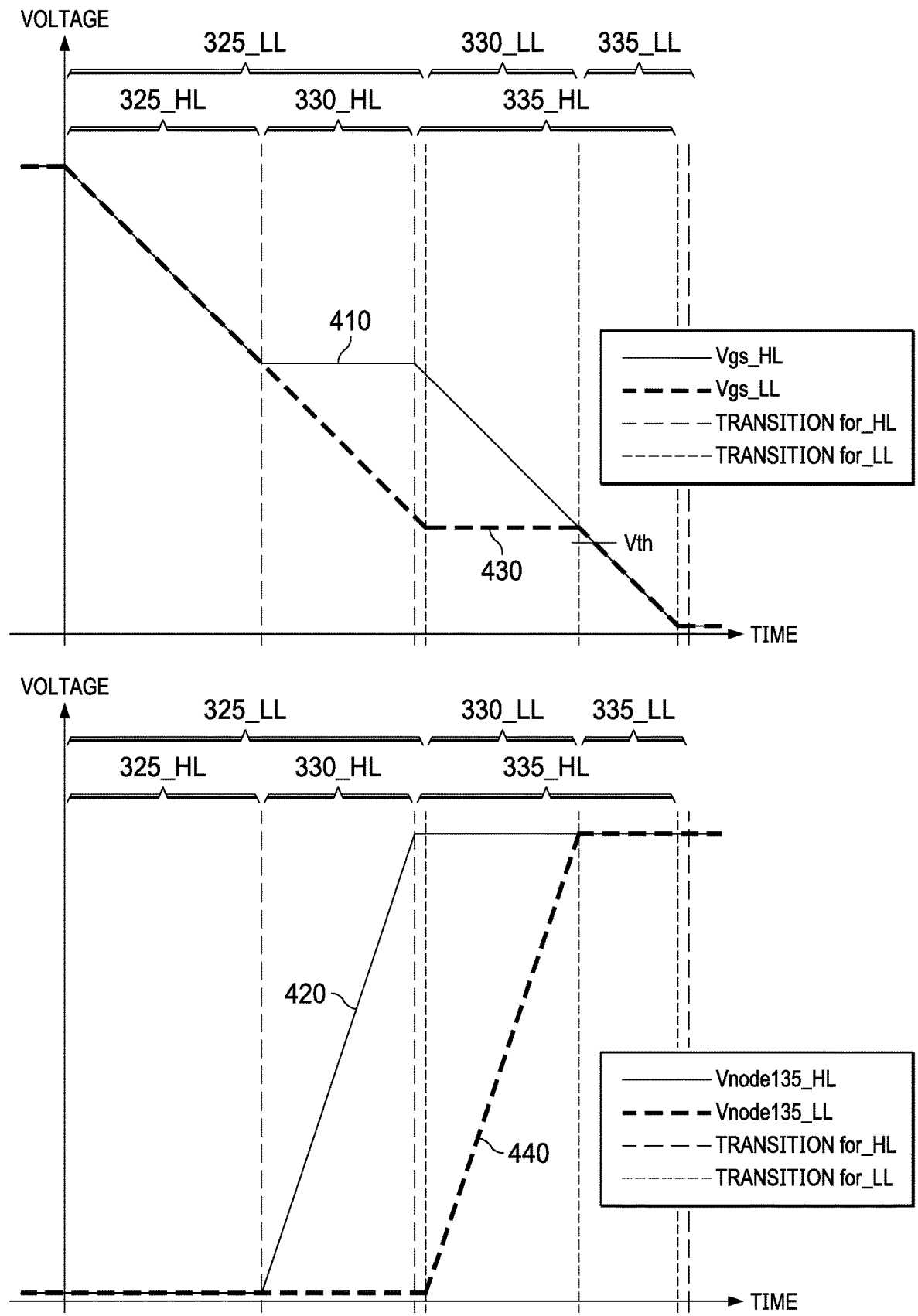
FIGS. 5A-C show gate to source voltages of a low side transistor with a higher load current and a lower load current, corrected gate to source voltages of a low side transistor with a higher load current and a lower load current, and the corresponding voltages on an output node of an example H bridge motor driver during transistor turn off.
Figure 5B:
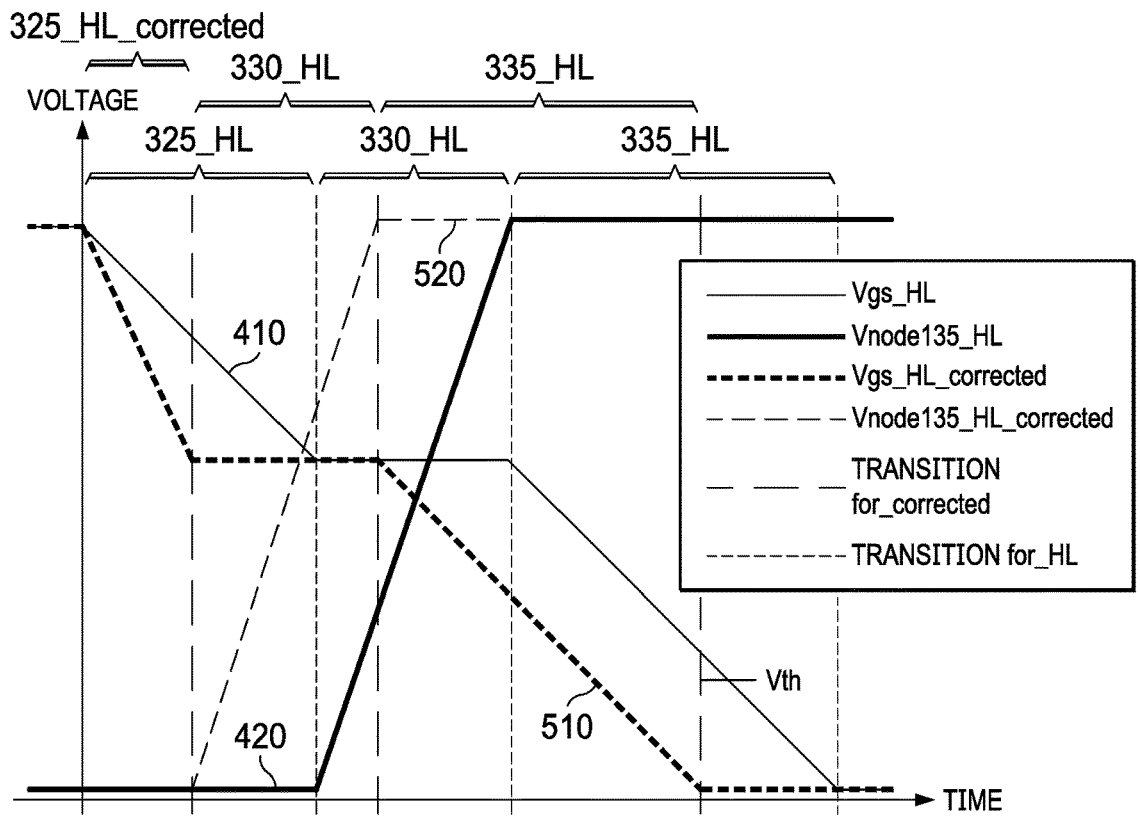
Figure 5C:
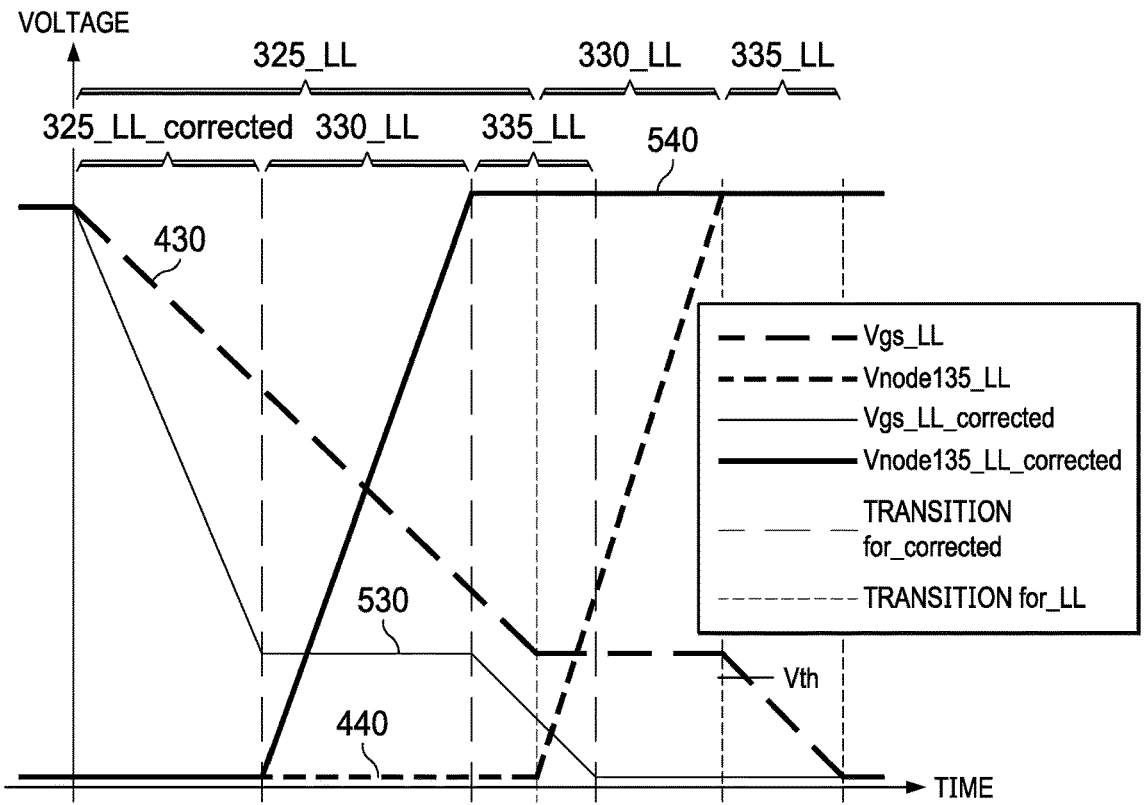

FIGS. 5A-C illustrate the variation in Miller voltages due to variation in load currents during transistor turn off. As discussed above with reference to FIGS. 4A-C, Vgs_HL 410 and Vnode135_HL 420 represent the gate to source voltage of M_H4 and the voltage on output node 135 while M_H4 passes a relatively high load current ILoad. Vgs_LL 430 and Vnode135_LL 440 represent the gate to source voltage of M_H4 and the voltage on output node 135 while M_H4 passes a relatively low load current ILoad. Because the desired load currents are different, Vgs_HL 410 and Vgs_LL 430 have different Miller voltages, and reach them at different times in transistor turn off. Because the Miller plateaus begin at different times, Vnode135_HL 420 and Vnode135_LL 440 increase at different times in transistor turn off. A gate driver circuit that generates drive current without sensing the load current ILoad is unable to determine the voltage transitions to and from the Miller regions 330, and so must be designed to accommodate all possible transition voltages.

The gate driver circuit must adjust the drive current Idrive to accommodate the desired slew rate in region 330 in response to the gate to source voltage reaching the highest possible Miller voltage corresponding to the highest possible load current, even where the load current ILoad and the Miller voltage are much lower, as shown with respect to Vgs_LL 430. FIG. 5A shows the gate to source voltage with a higher load current Vgs_HL 410 in combination with the corresponding output voltage Vnode135_HL 420 during turn off regions 325_HL, 330_HL, and 335_HL. FIG. 5A also shows the gate to source voltage with a lower load current Vgs_LL 430 in combination with the corresponding output voltage Vnode135_LL 440 during turn off regions 325_LL, 330_LL, and 335_LL. If the drive current Idrive is left the same for both the higher load current and the lower load current, the transistor completes turn off and reaches region 340 at the same time regardless of the load current.

FIG. 5B shows the conventional and corrected gate to source voltages of a low side transistor with a higher load current and the corresponding output voltage Vnode135_HL 420 and turn off regions 325_HL, 330_HL, 335_HL, and 335_HL_corrected. Conventional Vgs_HL 410 corresponds to a gate driver circuit that generates drive current without sensing the load current ILoad. In contrast, Vgs_HL_corrected 510 corresponds to a gate driver circuit that does sense the load current ILoad, and gauges the Miller voltage and Miller region 330 based on the sensed load current. This allows the gate driver circuit to correctly identify the transition from region 325 to region 330 and adjust the drive current Idrive accordingly. This decreases Vgs_HL_corrected 510 more quickly than Vgs_HL 410 decreases, shortening the length of time spent in region 325_HL_corrected compared to 325_HL, and completes transistor turn off sooner.

FIG. 5C shows the conventional and corrected gate to source voltages of a low side transistor with a lower load current and the corresponding output voltage Vnode135_LL 440 during turn off regions 325_LL, 330_LL, 335_LL, and 335_LL_corrected. Conventional Vgs_LL 430 corresponds to a gate driver circuit that generates drive current without sensing the load current ILoad. In contrast, Vgs_LL_corrected 530 corresponds to a gate driver circuit that does sense the load current ILoad, and gauges the Miller voltage and Miller region 330 based on the sensed load current. This allows the gate driver circuit to correctly identify the transition from region 325 to region 330 and adjust the drive current Idrive accordingly. This decreases Vgs_LL_corrected 530 more quickly than Vgs_LL 430 decreases, shortening the length of time spent in region 325_LL_corrected compared to 325_LL, and completes transistor turn off sooner.

Figure 6:
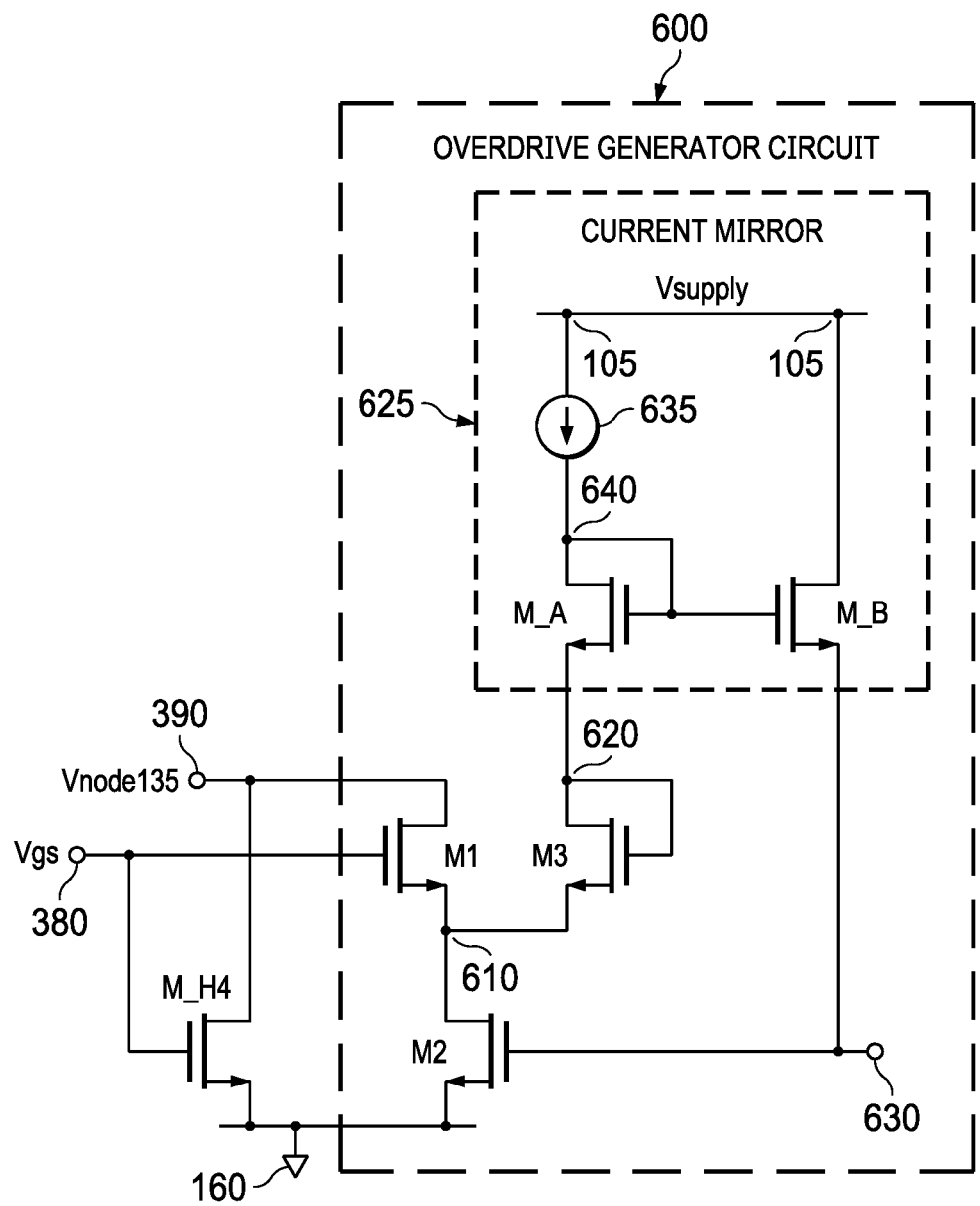
FIG. 6 illustrates an example overdrive generator circuit for a low side transistor in the example H bridge motor driver of FIG. 1.

FIG. 6 illustrates an example overdrive generator circuit 600 for a low side transistor in the example H bridge motor driver 100 of FIG. 1. The example overdrive generator circuit 600 is shown in connection with M_H4, but may be used with M_H2 in H bridge motor driver 100, or other low side transistors in other H bridge drivers. Overdrive generator 600 includes NMOS transistors M1, M2, and M3, as well as current mirror 625. In other examples, one or more of M1, M2, and M3 are bipolar junction transistors.

The drain terminal of M1 is coupled to output node 135, and the source terminal of M1 is coupled to the drain terminal of M2 at node 610. The gate terminal of M1 is configured to receive the gate voltage of M_H4 Vgs 380. The source terminal of M2 is coupled to common mode node 160, and the gate terminal of M2 is coupled to node 630. The source terminal of M3 is coupled to the source terminal of M1, and the drain terminal of M2 at node 610. The gate terminal and the drain terminal of M3 are coupled together and to current mirror 625 at node 620. M3 acts as a diode.

Current mirror 625 is further coupled to the gate terminal of M2 at node 630. In some examples, current mirror 625 includes NMOS transistors M_A and M_B, and current source 635. The source terminal of M_A is coupled to the gate and drain terminals of M3 at node 620. The gate and drain terminals of M_A are coupled together and to current source 635 at node 640. The gate terminal of M_B is coupled to the gate and drain terminals of M_A at node 640. The drain terminal of M_B is coupled to source voltage node 105, and the source terminal of M_B is coupled to the gate terminal of M2 at node 630.

M1 operates with the same gate voltage and the same drain voltage as M_H4, and so a portion of load current ILoad through M_H4 flows through M1 and M2 also. A voltage on the drain terminal of M2 is sensed through M3, which acts as a diode. Current mirror 625 outputs a voltage at node 630 which is proportional to the portion of the load current ILoad through M2. M2 is chosen to have similar characteristics to M_H4, and is maintained in the saturation region. This allows M2 to behave similarly to how M_H4 would behave in the saturation region, fully turned on, with the current load ILoad. This enables overdrive generator circuit 600 to function as a closed loop amplifier and convert the current load ILoad to a corresponding overdrive voltage. The overdrive voltage Von is proportional to $$\sqrt{\frac{ILoad}{K}},$$

where K represents the conductivity factor of M2. Because M2 and M_H4 are chosen to have similar characteristics, the conductivity factors of M2 and M_H4 are similar. The voltage on node 630 corresponds to Vth+Von, and is provided to other circuits, such as a gate driver circuit.

Figure 7:
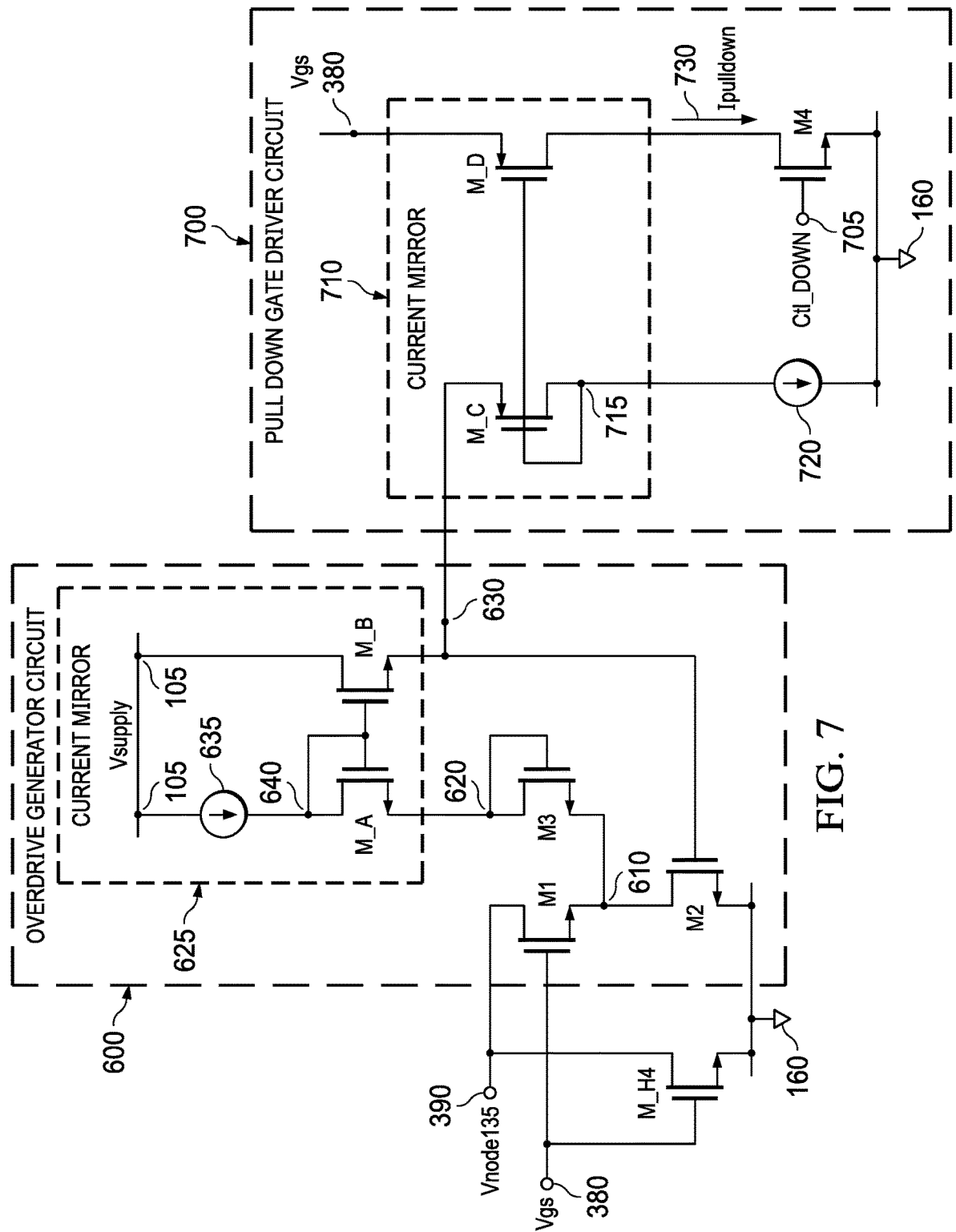
FIG. 7 illustrates an example pull-down gate driver circuit in combination with the example overdrive generator circuit of FIG. 6.

FIG. 7 illustrates an example pull-down gate driver circuit 700 coupled to the example overdrive generator circuit 600 of FIG. 6. Pull-down gate driver circuit 700 is shown in connection with M_H4 and gate driver circuit 140 of FIG. 1, but may be used in in connection with M_H2 and gate driver circuit 120, or other low side transistors and the associated gate driver circuits in other H bridge driver circuits as well. Pull-down gate driver circuit 700 includes current mirror 710, current source 720, and NMOS transistor M4. In other examples, M4 is a PMOS transistor. In other examples, M4 is a bipolar junction transistor.

Current mirror 710 is coupled to output node 630 of overdrive generator circuit 600, and receives Vth+Von for the load current ILoad through M_H4 in example H bridge motor driver 100. Current mirror 710 is further coupled to the gate terminal of M_H4, and receives the gate voltage Vgs 380. Current mirror 710 is further coupled to current source 720 and to the drain terminal of M4. The source terminal of M4 is coupled to common mode node 160, and the gate terminal of M4 is configured to receive a control signal Ctl_DOWN 705 for M_H4. M_H4 is turned off in response to Ctl_DOWN 705 being logic high. While Ctl_DOWN 705 indicates M_H4 should be turned off, M4 is kept in an on state, and acts like a closed switch.

Current mirror 710 compares Vth+Von to Vgs 380. The voltage difference between Vth+Von and Vgs 380 is indicative of where in region 325 of transistor turn off Vgs 380 is. The difference between Vth+Von and Vgs 380 is larger at the beginning of region 325 than at the end of region 325, where Vgs 380 reaches the Miller voltage. The pull-down current Ipulldown 730 generated by current mirror 710 is proportional to the voltage difference between Vth+Von and Vgs 380, such that a larger Ipulldown 730 is generated in response to a larger difference between Vth+Von and Vgs 380 at the beginning of region 325, and a smaller Ipulldown 730 is generated in response to a smaller difference between Vth+Von and Vgs 380 at the end of region 325.

In some examples, current mirror 710 includes PMOS transistors M_C and M_D. In other examples, M_C and M_D are NMOS transistors. In other examples, M_C and M_D are bipolar junction transistors. The source terminal of M_C is coupled to the output of overdrive generator circuit 600 at node 630. The gate and drain terminals of M_C are coupled together and to current source 720 at node 715. The gate terminal of M_D is coupled to the gate and drain terminals of M_C and to current source 720 at node 715. The source terminal of M_D is coupled to the gate terminal of M_H4, and configured to receive Vgs 380. The drain terminal of M_D is coupled to the drain terminal of M4.

M_D turns off in response to the voltage difference between Vth+Von and Vgs 380 being less than a threshold value, which is indicative of the end of region 325 and the beginning of region 330. Because the overdrive voltage Von is dependent on the load current ILoad, pull-down gate driver circuit 700 generates strong pull-down current Ipulldown until Vgs 380 reaches the Miller voltage corresponding to the existing ILoad, rather than the Miller voltage corresponding to the highest possible load current. This quickens transistor turn off by shortening the length of time spent in region 325, as shown by 325_HL_corrected in FIG. 5B and 325_LL_corrected in FIG. 5C.

Figure 8:
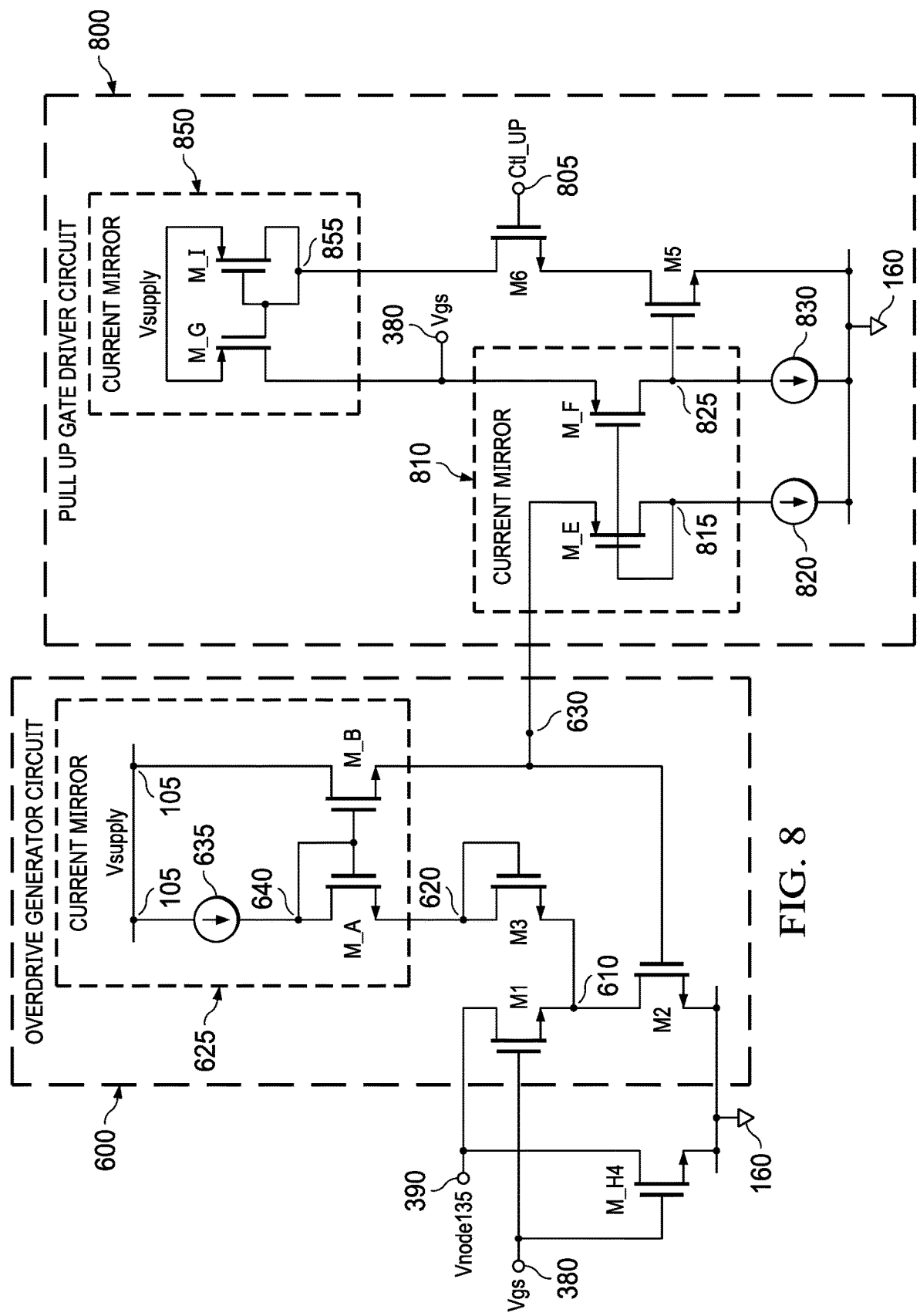
FIG. 8 illustrates an example pull-up gate driver circuit in combination with the example overdrive generator circuit of FIG. 6.

FIG. 8 illustrates an example pull-up gate driver circuit 800 in combination with the example overdrive generator circuit 600 of FIG. 6. Pull-up gate driver circuit 800 is shown in connection with M_H4 and gate driver circuit 140 of FIG. 1, but may be used in connection with M_H2 and gate driver circuit 120, or other low side transistors and the associated gate driver circuits in other H bridge driver circuits as well. Pull-up gate driver circuit 800 includes current mirror 810, current sources 820 and 830, current mirror 850, and NMOS transistors M5 and M6. In other examples, M5 and M6 are PMOS transistors. In other examples, M5 and M6 are bipolar junction transistors.

Current mirror 810 is coupled to output node 630 of overdrive generator circuit 600, and receives Vth+Von for the load current ILoad through M_H4 in example H bridge motor driver 100. Current mirror 810 is further coupled to the gate terminal of M_H4, and receives the gate voltage Vgs 380. Current mirror 810 is further coupled to current source 820, and to current source 830 and the gate terminal of M5 at node 825. Current mirror 850 is coupled to the gate terminal of M_H4, and receives the gate voltage Vgs 380. Current mirror 850 is further coupled to the drain terminal of M6. The gate terminal of M6 is configured to receive a control signal Ctl_UP 805 for M_H4. M_H4 is turned on in response to Ctl_UP 805 being logic high. While Ctl_UP 805 indicates M_H4 should be turned on, M6 is kept in an on state and acts like a closed switch. The source terminal of M6 is coupled to the drain terminal of M5. The source terminal of M5 is coupled to common mode node 160, and the gate terminal of M5 is coupled to current mirror 810 and current source 830 at node 825.

Current mirror 810 compares Vth+Von to Vgs 380. The voltage difference between Vth+Von and Vgs 380 is indicative of where in region 315 of transistor turn on Vgs 380 is. The difference between Vth+Von and Vgs 380 is smaller at the beginning of region 315 than at the end of region 315, where Vgs 380 reaches the turn on voltage. In response to Vgs 380 being greater than Vth+Von, the current generated by current mirror 810 and applied to the gate terminal of M5 is logic high. This causes M5 to turn on and act as a closed switch. While both M5 and M6 are turned on and acting as closed switches during region 315, current mirror 850 generates a pull-up current proportional to the voltage difference between Vth+Von and Vgs 380. A smaller pull-up current is generated in response to a smaller difference between Vth+Von and Vgs 380 at the beginning of region 315, and a larger pull-up current is generated in response to a larger difference between Vth+Von and Vgs 380 at the end of region 315.

In some examples, current mirror 810 includes PMOS transistors M_E and M_F. In other examples, M_E and M_F are NMOS transistors. In other examples, M_E and M_F are bipolar junction transistors. The source terminal of M_E is coupled to the output of overdrive generator circuit 600 at node 630. The gate and drain terminals of M_E are coupled together and to current source 820 at node 815. The gate terminal of M_F is coupled to the gate and drain terminals of M_E and to current source 820 at node 815. The source terminal of M_F is coupled to the gate terminal of M_H4 and configured to receive Vgs 380. The drain terminal of M_F is coupled to current source 830 and the gate terminal of M5 at node 825. M_F is kept in an off state in response to the voltage difference between Vth+Von and Vgs 380 being less than a threshold value, which is indicative of regions 305 and 310 during transistor turn on. As Vgs 380 increases above the Miller voltage and transitions into region 315, the voltage difference between Vth+Von and Vgs 380 increases above the threshold value, and M_F turns on, causing current mirror 810 to generate current and M5 to turn on.

In some examples, current mirror 850 includes PMOS transistors M_G and M_I. In other examples, M_G and M_I are NMOS transistors. In other examples, M_G and M_I are bipolar junction transistors. The source terminal of M_G is coupled to the source terminal of M_I and to a supply voltage Vsupply. The gate and drain terminals of M_I are coupled together and to the drain terminal of M6 at node 855. The gate terminal of M_G is coupled to the gate and drain terminals of M_I and to the drain terminal of M6 at node 855. The drain terminal of M_G is coupled to the gate terminal of M_H4 and configured to receive Vgs 380.

Figure 9:
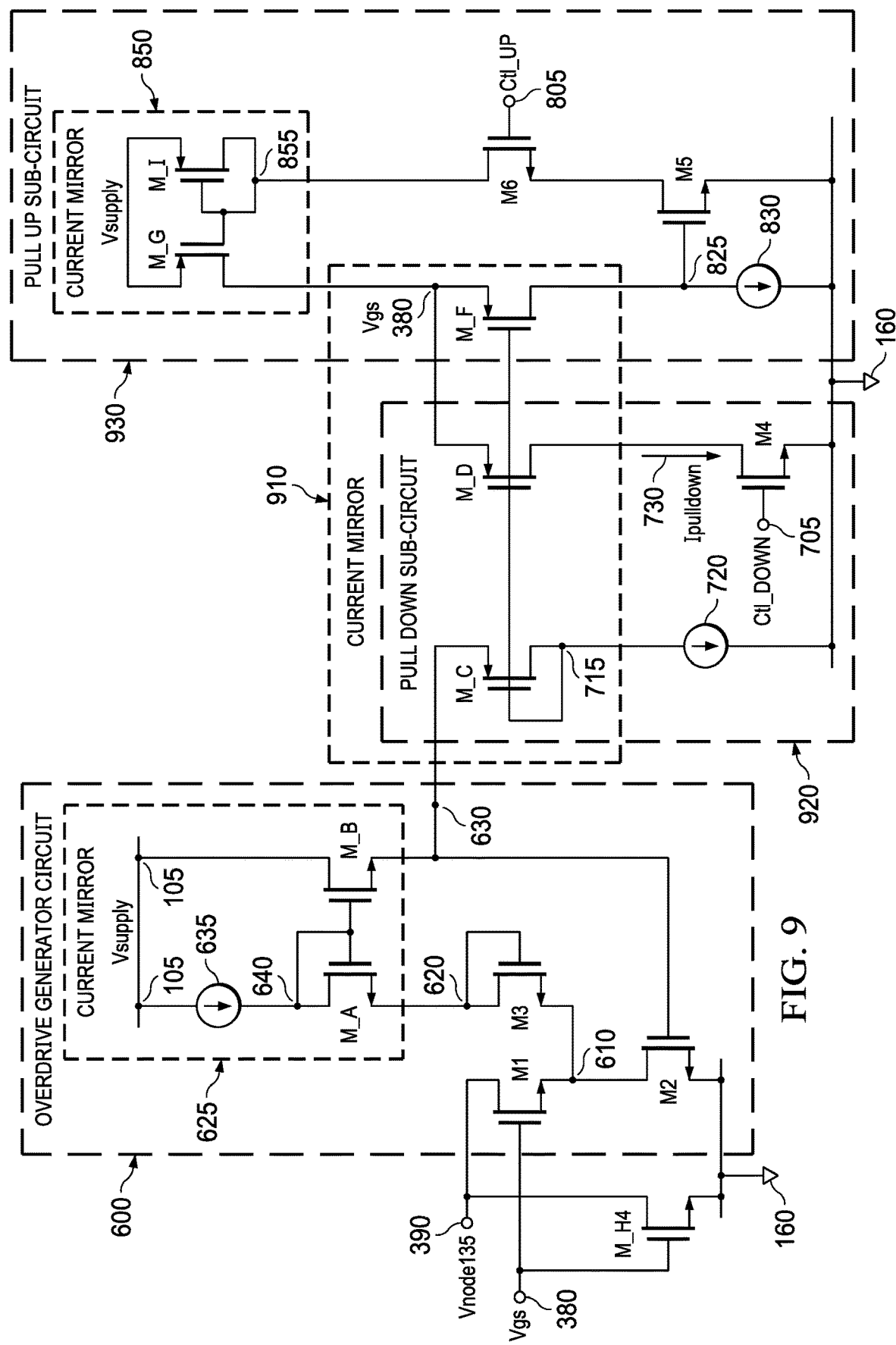
FIG. 9 illustrates an example gate driver circuit for a low side transistor in the example H bridge motor driver of FIG. 1.

FIG. 9 illustrates an example gate driver circuit 900 for a low side transistor in the example H bridge motor driver of FIG. 1, combining the features of overdrive generator circuit 600 of FIG. 6, pull-down gate driver circuit 700 of FIG. 7, and pull-up gate driver circuit 800 of FIG. 8. Gate driver circuit 900 is shown in connection with M_H4 and gate driver circuit 140 of FIG. 1, but may be used in connection with M_H2 and gate driver circuit 120, or other low side transistors and the associated gate driver circuits in other H bridge driver circuits as well. Gate driver circuit 900 includes current mirror 910, pull-down sub-circuit 920, and pull-up sub-circuit 930. Pull-down sub-circuit 920 includes current source 720 and NMOS transistor M4. Pull-up sub-circuit 930 includes current source 830, current mirror 850, and NMOS transistors M5 and M6. In other examples, M4, M5, and M6 are PMOS transistors. In other examples, M4, M5, and M6 are bipolar junction transistors.

Current mirror 910 is coupled to output node 630 of overdrive generator circuit 600, and receives Vth+Von for the load current ILoad through M_H4 in example H bridge motor driver 100. Current mirror 910 is further coupled to the gate terminal of M_H4, and receives the gate voltage Vgs 380. Current mirror 910 is further coupled to current source 720, the drain terminal of M4, and current source 830 and the gate terminal of M5 at node 825. The source terminal of M4 is coupled to common mode node 160, and the gate terminal of M4 is configured to receive a control signal Ctl_DOWN 705 for M_H4. M_H4 is turned off in response to Ctl_DOWN 705 being logic high. While Ctl_DOWN 705 indicates M_H4 should be turned off, M4 is kept in an on state and acts like a closed switch.

The source terminal of M5 is coupled to common mode node 160, and the drain terminal of M5 is coupled to the source terminal of M6. The gate terminal of M6 is configured to receive a control signal Ctl_UP 805 for M_H4. M_H4 is turned on in response to Ctl_UP 805 being logic high. While Ctl_UP 805 indicates M_H4 should be turned on, M6 is kept in an on state and acts like a closed switch. Ctl_DOWN 705 and Ctl_UP 805 are not both logic high at the same time. The drain terminal of M6 is coupled to current mirror 850. Current mirror 850 is further coupled to the gate terminal of M_H4, and receives the gate voltage Vgs 380.

In some examples, current mirror 910 includes PMOS transistors M_C, M_D, and M_F. In other examples, M_C, M_D, and M_F are NMOS transistors. In other examples, M_C, M_D, and M_F are bipolar junction transistors. Each bipolar junction transistor includes a control input (base) corresponding to the gate terminal, and a pair of current terminals (collector and emitter) corresponding to the drain and source terminals. The source terminal of M_C is coupled to the output of overdrive generator circuit 600 at node 630. The gate and drain terminals of M_C are coupled together and to current source 720 at node 715. The gate terminal of M_D is coupled to the gate and drain terminals of M_C and to current source 720 at node 715. The source terminal of M_D is coupled to the gate terminal of M_H4 and configured to receive Vgs 380. The drain terminal of M_D is coupled to the drain terminal of M4.

M_D is kept in an off state in response to the voltage difference between Vth+Von and Vgs 380 being less than a threshold value, such as during regions 305, 310, 330, and 335. The gate terminal of M_F is coupled to the gate and drain terminals of M_C, the gate terminal of M_D, and to current source 720 at node 715. The source terminal of M_F is coupled to the gate terminal of M_H4, and configured to receive Vgs 380. The drain terminal of M_F is coupled to current source 830 and the gate terminal of M5 at node 825. M_F is kept in an off state in response to the voltage difference between Vth+Von and Vgs 380 being less than a threshold value, such as during regions 305, 310, 330, and 335.

In some examples, current mirror 850 includes PMOS transistors M_G and M_I. In other examples, M_G and M_I are NMOS transistors. In other examples, M_G and M_I are bipolar junction transistors. The source terminal of M_G is coupled to the source terminal of M_I and to a supply voltage Vsupply. The gate and drain terminals of M_I are coupled together and to the drain terminal of M6 at node 855. The gate terminal of M_G is coupled to the gate and drain terminals of M_I and to the drain terminal of M6 at node 855. The drain terminal of M_G is coupled to the gate terminal of M_H4 and configured to receive Vgs 380.

Current mirror 910 compares Vth+Von to Vgs 380. The voltage difference between Vth+Von and Vgs 380 is indicative of which region of transistor turn on or turn off Vgs 380 is. During transistor turn on, Ctl_UP 805 is logic high, and M6 is in an on state and acts like a closed switch. Ctl_DOWN 705 is logic low, and M4 is in an off state and acts like an open switch. No pull-down current Ipulldown 730 is generated. While Vgs 380 is greater than Vth+Von, the current generated by current mirror 910 and applied to the gate terminal of M5 is logic high. This causes M5 to turn on and act as a closed switch. In response to both M5 and M6 acting as closed switches during region 315, current mirror 850 generates a pull-up current proportional to the voltage difference between Vth+Von and Vgs 380. A smaller pull-up current is generated in response to a smaller difference between Vth+Von and Vgs 380 at the beginning of region 315, and a larger pull-up current is generated in response to a larger difference between Vth+Von and Vgs 380 at the end of region 315.

During transistor turn off, Ctl_UP 805 is logic low, and M6 is in an off state and acts like an open switch. No pull-up current is generated. Ctl_DOWN 705 is logic high, and M4 is in an on state and acts as a closed switch. During transistor turn off, the voltage difference between Vth+Von and Vgs 380 is indicative of where in region 325 of transistor turn off Vgs 380 is. The pull-down current Ipulldown 730 generated by current mirror 910 is proportional to the voltage difference between Vth+Von and Vgs 380, such that a larger Ipulldown 730 is generated in response to a larger difference between Vth+Von and Vgs 380 at the beginning of region 325, and a smaller Ipulldown 730 is generated in response to a smaller difference between Vth+Von and Vgs 380 at the end of region 325.

In this description, the term "couple" or "couples" means either an indirect or direct wired or wireless connection. Thus, if a first device couples to a second device, that connection may be through a direct connection or through an indirect connection via other devices and connections. The recitation "based on" means "based at least in part on." Therefore, if X is based on Y, X may be a function of Y and any number of other factors.

Modifications are possible in the described embodiments, and other embodiments are possible, within the scope of the claims.

What is claimed is:
1. A pull-down driver circuit, comprising:
  a first transistor having a first terminal, a second terminal and a control gate;
  a second transistor having a first terminal, a second terminal and a control gate wherein the first terminal of the first transistor is coupled to the second terminal of the second transistor;
  a third transistor having a first terminal, a second terminal and a control gate wherein the first terminal of the third transistor is coupled to the first terminal of the first transistor and to the second terminal of the second transistor;
  a first current mirror having two outputs wherein a first output is coupled to the second terminal of the third transistor and wherein in a second output is coupled to the control gate of the second transistor;
  a second current mirror having two inputs and three outputs wherein a first input is coupled to the second output of the first current mirror;

a first current source having two terminals wherein a first terminal is coupled to a first output of the second current mirror; and a fourth transistor having a first terminal, a second terminal and a control gate wherein the first terminal is coupled to the second output of the second current mirror.

2. The pull-down driver circuit of claim 1, wherein the first, second, third, and fourth transistors are n-type metal oxide semiconductor field effect transistors.

3. The pull-down driver circuit of claim 1, wherein the first, second, third, and fourth transistors are bipolar junction transistors.

4. The pull-down driver circuit of claim 1, wherein the pull-down driver circuit is coupled to a low side transistor in an H bridge driver, and wherein the second transistor is matched to the low side transistor in the H bridge driver.

5. The pull-down driver circuit of claim 4, wherein:
the second terminal of the first transistor is coupled to a current terminal of the low side transistor in the H bridge driver and configured to receive a first voltage, and the second input of the second current mirror and the control gate of the first transistor are coupled to a control input of the low side transistor in the H bridge driver and configured to receive a second voltage.

6. A pull-up driver circuit, comprising:
a first transistor having a first terminal, a second terminal and a control gate;
a second transistor having a first terminal, a second terminal and a control gate wherein the first terminal of the first transistor is coupled to the second terminal of the second transistor;
a third transistor having a first terminal, a second terminal and a control gate wherein the first terminal of the third transistor is coupled to the first terminal of the first transistor and to the second terminal of the second transistor;
a first current mirror having two outputs wherein a first output is coupled to the second terminal of the third transistor and wherein in a second output is coupled to the control gate of the second transistor;
a second current mirror having two inputs and three outputs wherein a first input is coupled to the second output of the first current mirror;
a first current source having two terminals wherein a first terminal is coupled to a first output of the second current mirror;

a fourth transistor having a first terminal, a second terminal and a control gate wherein the first terminal is coupled to the second output of the second current mirror;

a third current mirror having two outputs; and a fifth transistor having a first terminal, a second terminal and a control gate wherein the first terminal is coupled to a second output of the third current mirror.

7. The pull-up driver circuit of claim 6, wherein the pull-up driver circuit is coupled to a low side transistor in an H bridge driver, and wherein the second transistor is matched to the low side transistor in the H bridge driver.

8. The pull-up driver circuit of claim 7, wherein:
a second terminal of the first transistor is coupled to a current terminal of the low side transistor in the H bridge driver and configured to receive a first voltage, and the second input of the second current mirror, the first output of the third current mirror, and the control gate of the first transistor are coupled to a control input of the low side transistor in the H bridge driver and configured to receive a second voltage.

9. The pull-up driver circuit of claim 8, wherein the first output of the first current mirror varies based on a load current through the low side transistor in the H bridge driver.

10. The pull-up driver circuit of claim 6, wherein the first current mirror comprises:
a second current source having an input and an output;
a sixth transistor having a first terminal, a second terminal and a control gate wherein the first terminal of the sixth transistor is coupled to the output of the second current source; and a seventh transistor having a first terminal, a second terminal and a control gate wherein the control gate of the sixth transistor is coupled to the control gate of the seventh transistor.

11. The pull-up driver circuit of claim 10, wherein a first terminal of the seventh transistor is coupled to the control gate of the second transistor.

12. The pull-up driver circuit of claim 6, wherein the second current mirror comprises:
an eighth transistor having a first terminal, a second terminal and a control gate wherein the first terminal of the eighth transistor is coupled to the input of the input current source.

* * * * *